United States Patent [19]
Caterer et al.

[11] Patent Number: 5,935,763
[45] Date of Patent: *Aug. 10, 1999

[54] SELF-ALIGNED PATTERN OVER A REFLECTIVE LAYER

[75] Inventors: Michael Dean Caterer, Jericho Center; Timothy Harrison Daubenspeck, Colchester; Thomas George Ference, Essex Junction; Edmund Juris Sprogis, Underhill, all of Vt.

[73] Assignee: International Business Machines Corporation, Armonk, N.Y.

[ * ] Notice: This patent issued on a continued prosecution application filed under 37 CFR 1.53(d), and is subject to the twenty year patent term provisions of 35 U.S.C. 154(a)(2).

[21] Appl. No.: 08/664,283
[22] Filed: Jun. 11, 1996
[51] Int. Cl.$^6$ .................................................. G03F 7/00
[52] U.S. Cl. ........................................ 430/313; 430/315
[58] Field of Search .................... 430/313, 395, 430/314, 315, 396; 438/109, 618

[56] References Cited

U.S. PATENT DOCUMENTS

| | | | |
|---|---|---|---|
| 4,102,683 | 7/1978 | DiPiazza | 96/38.4 |
| 4,379,833 | 4/1983 | Canavello et al. | 430/395 |
| 4,828,967 | 5/1989 | Mase et al. | 430/315 |
| 4,931,380 | 6/1990 | Owens et al. | 430/296 |
| 4,978,604 | 12/1990 | Banks et al. | 430/327 |
| 5,107,586 | 4/1992 | Eichelberger et al. | 29/830 |
| 5,466,634 | 11/1995 | Beilstein et al. | 437/180 |
| 5,478,781 | 12/1995 | Bertin et al. | 437/209 |
| 5,517,754 | 5/1996 | Beilstein, Jr. et al. | 438/109 |

OTHER PUBLICATIONS

"Semiconductor Lithography Principles, Practices, and Materials", Wayne M. Moreau, Microdevices Physics and Fabriction Technologies, Plenum Press, 1987.

*Primary Examiner*—Kathleen Duda
*Attorney, Agent, or Firm*—James M. Leas

[57] ABSTRACT

An opening in an insulator on a substrate is self-aligned to a reflective region on the substrate. The opening is formed by shining blanket radiation on photoresist on the insulator and developing to open the resist and insulator. The resist region that is above the reflective region absorbs both incident and reflected radiation, a larger total dose of radiation than is absorbed by resist above non-reflective regions. The incident dose is adjusted to provide a below threshold dose everywhere except to those regions of resist that are above highly reflective regions.

18 Claims, 8 Drawing Sheets

SELF-ALIGNED PATTERN OVER A REFLECTIVE LAYER

FIELD OF THE INVENTION

This invention generally relates to patterning photosensitive material. More particularly, it relates to a method of forming openings in photosensitive material on a substrate self-aligned to structures on the substrate. Even more particularly it relates to a method of providing openings in photosensitive material self-aligned to transfer metal edges on a side face of a stack of chips. It also relates to a method of providing a planarized insulator self-aligned to a metal on a semiconductor wafer.

BACKGROUND OF THE INVENTION

The use of multiple layers of chips provides the opportunity to form very dense electronic circuitry with a very high rate of communication between chips in the stack. The key problem has been to provide wiling to interconnect the chips and for external contact.

In one well known chip stacking structure, transfer wires embedded in insulation on the planar surface of each chip of the stack extend between chip circuits and one edge of the chip, these chip edges forming a side face of the stack. Stacks of adhesively bonded together chips have these chip edges aligned. Large T-connect pads for interconnection and external connection are located on that side face contacting ends of those transfer wires.

Because the chips may vary significantly in thickness and alignment, and because the adhesive and insulation between chips may vary in thickness, the position of a transfer wire end on the side face is uncertain. The uncertainty has made quite difficult the traditional photolithographic semiconductor processing method of using a mask to open contact through an insulator to all desired locations on the side face at once.

One proposed solution, described in U.S. Pat. No. 4,525, 921, to Carsen et al. (the '921 Patent), was to selectively etch the silicon on the side face, thereby leaving tips of transfer wires extending beyond the etched silicon surface. A side face insulator, such as polyimide, was then deposited and polished back to expose the tips of transfer wiling for electrical contact. Now, metal could be deposited and T-connect pads photolithographically formed without risk of shorting to conductive edges of the silicon chips since the conductive silicon surface was covered by the side face insulator. A problem with the solution of the '921 Patent was that the silicon-polyimide interface was seriously eroded by the silicon etch, leaving a gap therebetween creating significant downstream processing problems. In addition, the process exposed for contact, not just the desired transfer wire but all metal layers that happened to be along the chip edge, including lower level kerf metal layers. The T-connect pads next deposited tended to short all these metal layers together.

An alternative proposed solution, shown in U.S. Pat. No. 5,478,781 to Bertin et al., formed a via in insulation on the edge of each chip of the stack. Significant attention was needed in opening this via to avoid exposing lower levels of metal and bare silicon edges of the chips during the steps to expose and contact the transfer wires. The spacing and alignment variations necessitated (1) the addition of thicker insulation between stacked chips, (2) the use of extra masking steps on the chip planar surface at wafer level, and (3) extra photoexposure and masking steps on the side face of the stack to avoid opening contact to kerf metal and conductive chip edges. In addition, the use of thicker insulation between chips added significantly to mechanical problems in providing for external contact because polymeric insulation, such as polyimide, has a thermal expansion coefficient much greater than that of silicon.

Thus, a better solution is needed that provides a lower cost and more reliable method of forming contact pads at the ends of each transfer wire on the side face of the stack, the contacts well insulated from the silicon substrates and kerf metal, and this solution is provided by the following invention.

SUMMARY OF THE INVENTION

It is therefore an object of the present invention to provide openings in a layer of photoactive material on a surface that are self-aligned to a material on the surface.

It is another object of the present invention to use a property of a surface to selectively expose a portion of a layer of photoactive material to provide a self-aligned pattern.

It is another object of the present invention to provide differential exposure of a layer of photoactive material on a substrate without a mask, the differential exposure based on differential reflectivity of structures on the substrate.

It is another object of the present invention to provide an opening in an insulator that is self-aligned to the end of each transfer wire reaching the side face of a stack of integrated circuit chips.

It is an other object of the present invention to provide a planarized insulator self-aligned to a metal on a semiconducting wafer, each metal layer having self-aligned insulation.

It is a feature of the present invention that self-alignment is achieved with a blanket exposure of photoresist.

It is an advantage of the present invention that differential exposure of a photoactive layer is achieved without a mask to provide a desired pattern.

These and other objects, features, and advantages of the invention are accomplished by a method of forming a self-aligned opening, comprising the steps of providing a surface having a first region and a second region, the first region having a first magnitude of an optical property, the second region having a second magnitude of an optical property, there being a difference in the optical property magnitudes between the first and second regions; depositing a layer of photoactive material on the first and second regions; shining equal incident radiation on the photoactive material on the first and second regions wherein the photoactive material on the first and second regions are differentially exposed as a result of the difference in optical property magnitude; and forming an opening in the layer of photoactive material self-aligned to the first region.

Another aspect of the invention is a structure, comprising a substrate surface comprising a first region and a second region. The first region has a first magnitude of a surface property and the second region has a second magnitude of the surface property, there being a difference in the first and second magnitudes. A layer of insulator is on the surface, the layer of insulator has a top surface extending to a plane higher than the first region. The layer of insulator has an opening that is self-aligned to the first region.

BRIEF DESCRIPTION OF THE DRAWINGS

The foregoing and other objects, features, and advantages of the invention will be apparent from the following detailed description of the invention, as illustrated in the accompanying drawings, in which.

DETAILED DESCRIPTION OF THE INVENTION

The present invention provides maskless patterning of a photoactive material on a substrate that has regions having different reflectivities. A blanket incident beam of radiation is shined on the photoactive coating. The high reflectivity region will provide a higher exposure dose to the photoactive material and this difference in dose to the photoactive material is exploited during a develop step to form an opening in the material self-aligned to the desired region on the substrate.

In one embodiment, the invention provides openings in a layer of insulation. The openings are self-aligned to the reflective ends of transfer wiring extending to the side face of a stack of semiconductor chips. The openings, being exclusively where needed, improve yield with respect to shorting to adjacent conductors. The invention permits the formation of T-connect pads that are electrically isolated from the silicon substrates of adjacent chips and in reliable contact with the transfer metal of each chip of the stack.

The photoactive material of the present invention may be photoresist that masks a later etching or liftoff step and is later removed from the chip. Or the photoactive material may be an insulator, such as photoactive polyimide that remains on the chip after all processing is complete.

Prepositions, such as "on" and "higher" are defined with respect to a semiconductor surface, regardless of the orientation the structure is actually held. That surface may be the conventional planar surface of a semiconductor chip or wafer or it may be a planar side face of a stack of semiconductor chips. A planar side face of a stack of semiconductor chips includes semiconductor edges of the chips, insulation, and adhesive therebetween. A layer is on another layer even if there are intervening layers.

It has long been known in the art that the time required to sufficiently expose photoresist increases with thicker films or lower reflectivity substrates. For example, the book, *Semiconductor Lithography, Principles Practices*, ad Materials, by Wayne M. Moreau ("the Moreau book"), in Table 8-4-3 on page 389, illustrates the effect on exposure time of variations in the thickness of resist and variations in the reflectivity of substrate on a 1 µm thick resist. The data shows that as reflectivity increases from 10% to 30% exposure time decreases from 7 seconds to 5 seconds, and as reflectivity increases to 80%, exposure time decreases to 3 seconds. But this variation in exposure time with substrate reflectivity has long been considered a problem, producing such effects as notching over a step in the substrate—a large variation in line width depending on the reflectivity and the angle of reflection caused by the step.

U.S. Pat. No. 4,102,683 (the "'683 patent"), for example, points out that as a result of light being reflected back and forth between the substrate and the photomask as well as light being scattered from surface irregularities, there may be a pronounced effect upon the resolution which can be obtained in defining the photosensitive material. The '683 patent eliminates the problem by providing an antireflective coating between the substrate and the resist. Other solutions to avoid the unwanted reflections have been to adjust the absorptivity of the resist, to add a dye to the resist, to add a coating on top of the resist, and to adjust the resist thickness. By contrast, the present inventors have found a constructive use for the variation in required exposure dose with reflectivity to provide openings in desired regions of a resist without a mask that are self-aligned to reflective surfaces on the substrate.

Figure 1:
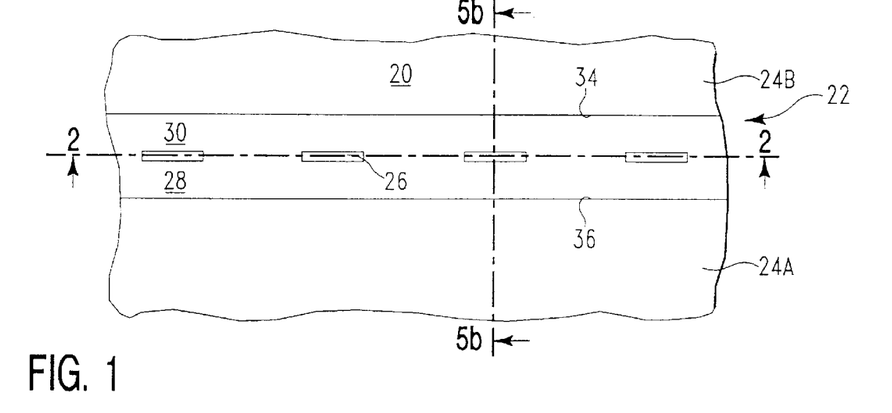
FIG. 1 is a top view of the side face of a stack of chips showing two chips, the insulation therebetween, and transfer wires extending through the insulation to the side face.
Figure 2:
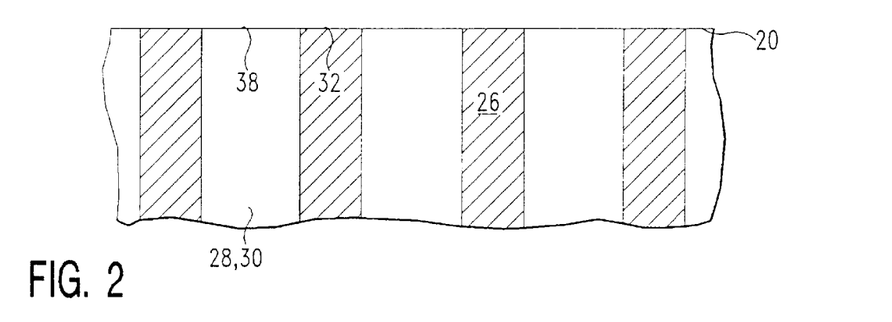
FIG. 2 is a cross sectional view through the transfer wires and insulation of FIG. 1 after polishing of the side face is complete.

FIGS. 1–6 show steps in the process of fabricating a self-aligned contact through an insulating layer on a surface having regions with different reflectivity. FIG. 1 shows a top view of a portion of side face 20 of stack 22, including chips 24a and 24b and transfer metal wires 26 embedded in insulating layers 28 and 30, the stack formed by conventional stack processing, well known in the art. FIG. 2 shows a cross section taken through transfer metal wires 26 after side face 20 has been polished to a planar surface exposing ends 32 of transfer metal wire 26. Insulating layers 28 and 30, formed during wafer processing, isolate transfer metal wires 26 from lower levels of metal on chip 24a and from back surface 34 of adjacent chip 24b. Insulating layers 28 and 30 together have a thickness of about 25 µm, though it is desirable to limit the combined thickness to 15 µm or less to minimize thermal expansion effects.

Transfer metal wire 26 connects circuits on chip 24a to edge 38 of chip 24a and side face 20 of stack 22, as shown in FIG. 2. Transfer metal wire 26 may be one of the standard wiring levels of a chip. However, transfer metal wire 26 is commonly an extra level of metal that connects a standard external contact pad of chip 24a to edge 38. Transfer metal wire 22 is formed of a metallic conductor, such as aluminum. Transfer metal wire 26 can also be a metal such as copper, chrome, nickel, or gold. Insulating layers 28 and 30, through which transfer metal wire 26 extends, are formed from an insulator such as polyimide, silicon dioxide, or silicon nitride. Insulating layer 30 includes a top layer of adhesive for gluing chips 24a and 24b together, and this layer is formed from a material, such as Thermid, as described in commonly assigned U.S. Pat. No. 5,478,781 to Bertin et al., incorporated herein by reference. Insulating layer 28, transfer metal wire 26 and insulating layer 30 are all formed during wafer processing, before individual chips are diced and formed into stacks.

Figure 3:
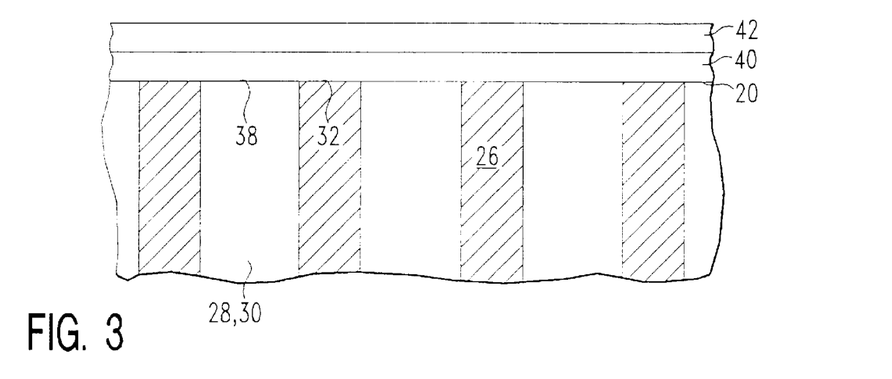
FIG. 3 is a cross sectional view of the side face after deposition of polyimide and photoresist.

Thin polyimide layer 40 is applied to side face 20 of stack 22, as shown in FIG. 3, and photoresist 42 is applied on polyimide layer 40. Alternatively, the function of layers 40 and 42 can be combined in a single layer of positive tone photoactive polyimide, such as "Sumiresin Excel," product number CRC-6090, manufactured by Sumitomo Bakelite Company. In this case a separate photoresist 42 is not needed, and the differential exposure described hereinbelow takes place within the photoactive polyimide layer.

Figure 4A:
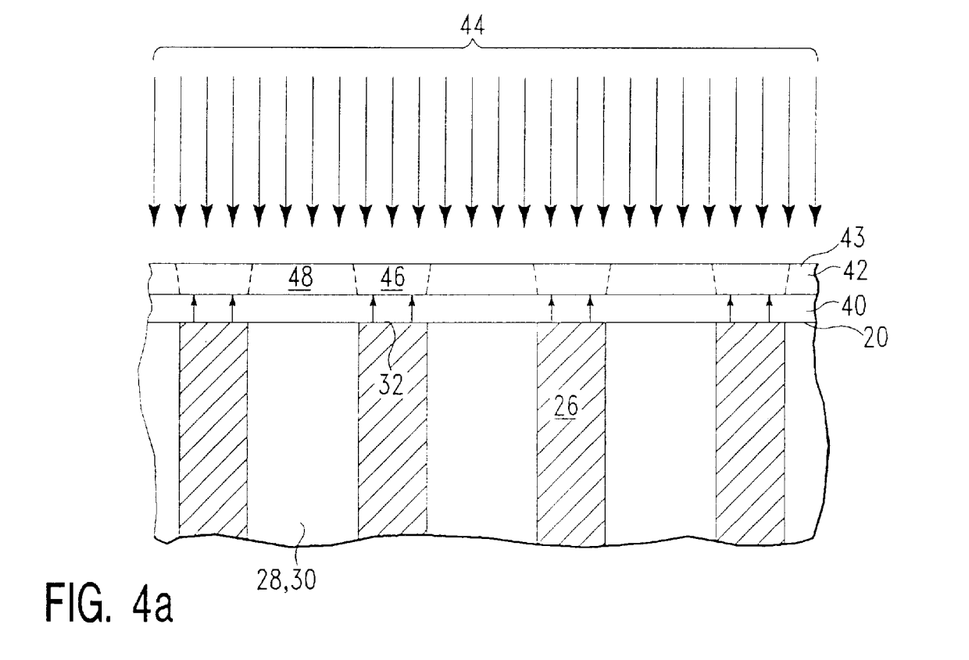
FIG. 4a is a cross sectional view of the side face during the exposure step showing that a blanket exposure provides a larger dose to the resist over the transfer wires than between transfer wires.

As illustrated schematically in FIG. 4a, side face 20 is then blanket exposed with uniform incident radiation beam 44 for a specified time to provide an incident dose to top surface 43 of photoactive material 42 of I joules/cm2. In addition, since ends 32 of transfer metal wire 26 reflect a portion R of incident radiation 44 back through regions 46 of photoresist 42, effectively giving regions 46 a second exposure, regions 46 are exposed to a total incident dose from two directions of I+R. By contrast, legions 48 of photoresist 42 that are not over ends 32 of transfer metal wire 26 do not get exposed to a significant amount of reflected radiation. Radiation striking regions 48 is transmitted through polyimide layers 28,30 between chips of the stack and therefore does not contribute an additional dose to regions 48 of photoresist 42. Thus, neglecting reflections from the air-photoresist interface and the photoresist-polyimide interface, regions 46 above transfer wire ends 32 are exposed to a total incident dose of I+R while regions 48 receive no more than incident dose I.

In practicing the invention it is important to provide uniform beam of incident radiation 44 with an incident exposure dose I that is below the threshold $I_T$ of the photoresist an amount such that I+R is nevertheless above that threshold. For positive resists the threshold is that dose for which the resist has significant solubility in the developer. At lower doses, of course, positive resist is still partially soluble. For example, using Shipley 7525 photoresist having a thickness of 2 $\mu$m, the present inventors found that an incident dose to top surface 43 of photoresist layer 42 of 95 mj/cm$^2$ is sufficient to provide the differential exposure to the photoresist required to open photoresist 42 exclusively over transfer metal wires 26.

Figure 4B:
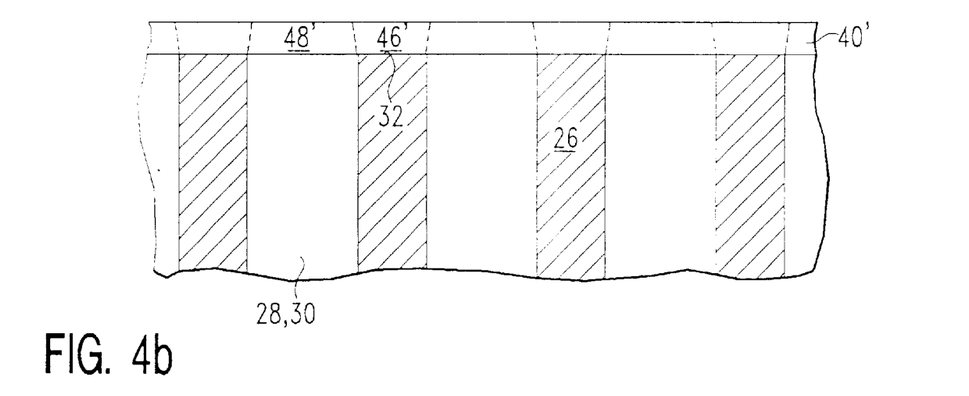
FIG. 4b is a cross sectional view of an alternate embodiment that uses a photoactive polyimide during the exposure step.
Figure 4C:
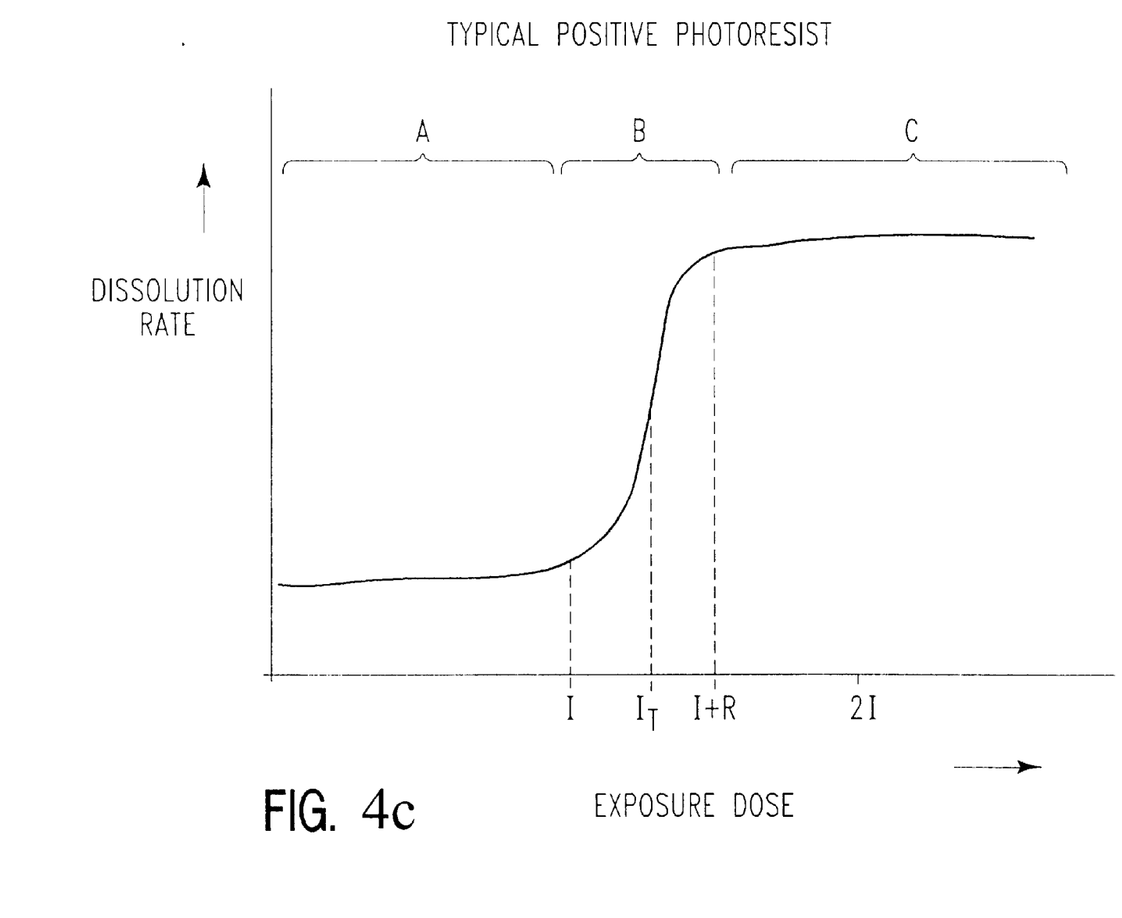
FIG. 4c is a dissolution curve for typical positive photoresist showing how a small additional dose to the resist can result in a vastly increased dissolution rate.

FIG. 4c shows a typical dissolution rate curve as a function of exposure dose for positive photoresist. It is seen that dissolution rate is above zero even without any exposure (region A of the curve) and the dissolution rate at first very gradually increases with dose. Then, near the threshold dose (region B of the curve), dissolution rate rapidly increases with dose, and the dissolution rate can far exceed the rate necessary to completely dissolve the resist in a given developer. Finally, at a high exposure, dissolution rate levels out again (region C of the curve).

The exposure dose axis of FIG. 4c shows incident dose I and threshold dose $I_T$. A simple example is shown of incident dose I that is half absorbed during its first pass through the resist. The other half is transmitted to end 32 of transfer wire 26. Assuming 100% reflection at end 32 of transfer wire 26, again half the reflected light is absorbed during its second pass through the resist. Thus, the total incident dose to both sides of resist in region 46 is 1.5 times as large as the dose to region 48. Alternatively, while the total dose absorbed by the resist over nonreflective regions is 0.5 times incident dose I, over end 32 of transfer wire 26 the absorbed dose is 0.5+0.5×0.5=0.75 times incident dose I. It is seen in FIG. 4c that because the slope of the dissolution curve in region B is steep, the additional dose over the reflective regions will produce a substantially higher dissolution rate than over the non-reflective regions, thus clearing the resist only over the reflective regions.

Figure 4D:
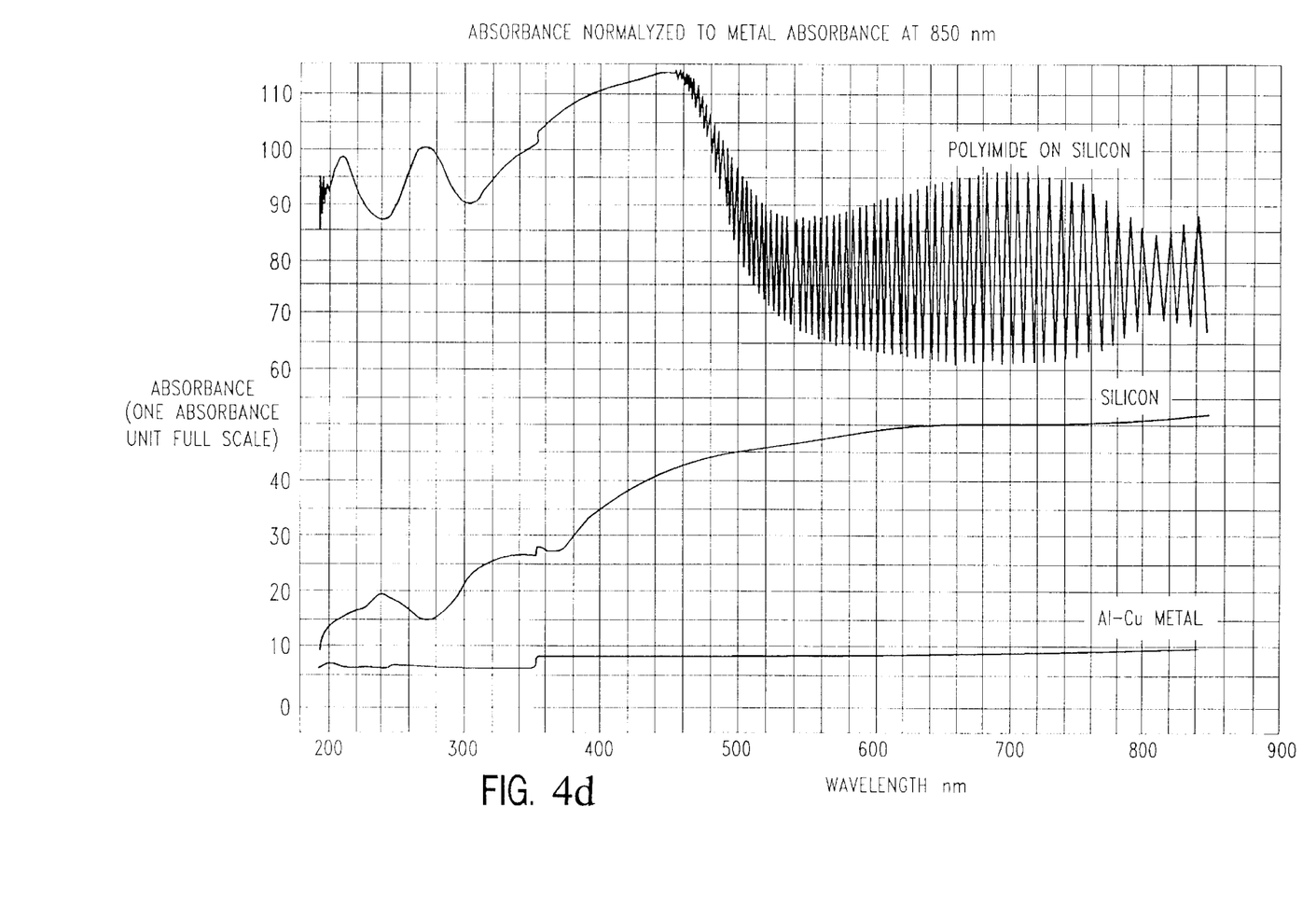
FIG. 4d shows absorbance as a function of wavelength for three materials: aluminum-copper metal, silicon, and thick polyimide.

FIG. 4d shows a measured absorbance curve as a function of wavelength for aluminum-copper metal, silicon, and polyimide-on-silicon. It is seen that the absorption of light is far higher for the polyimide-on-silicon than the absorption of light either of silicon or metal. The rapid changes in polyimide-on-silicon absorbance with wavelength are the result of interference of light reflected from top and bottom surfaces of the polyimide layer, an effect not specifically related to the present invention. It is clear that sensitivity for distinguishing metal and silicon from polyimide decreases as wavelength increases but that the sensitivity for distinguishing metal from silicon increases as wavelength increases. It is also clear that if silicon is distinguished, polyimide is always distinguished. Thus, for the present embodiment, the task is to provide an incident dose so that total radiation incident to resist over silicon is well below threshold while total incident radiation to resist above metal is at or above threshold. In that case, total incident radiation to resist above polyimide will also be below threshold.

A standard optical lithographic photoexposure tool, but without a mask, can be used to provide blanket incident radiation beam 44 to expose the entire side face 20 of stack 22. The radiation source should be capable of providing a stable and uniform illumination over the entire substrate surface. A mercury arc lamp, as found in most optical lithographic machines, is quite adequate for this purpose. The radiation can be of any type that exposes photoresist, including electromagnetic and particles, such as electrons and ions. A shutter or a frame can also be used to limit the blanket exposure to a desired area on side face 20 to avoid exposing resist over kerf metal lines, for example. Within this limited area, incident radiation beam 44 is still uniform as between regions 46 and 48, and the difference in absorbed dose still depends on reflection from ends 32 of transfer metal wires 26.

FIG. 4b shows an alternate embodiment in which single layer of photoactive polyimide 40' is used on side face 20. Ends 32 of transfer wires 26 reflect radiation so as to provide an additional dose to regions 46' as compared with regions 48'. Care must be taken with this embodiment, as described in the Moreau book on page 394, since for a resist coated on top of metal, "a severe reflection problem can arise at the metal photoresist interface where the tangential electric field is shortened by the conductive film and there is practically no exposure at all." Moreau presents several practical solutions to this problem, including an angle exposure and mechanical vibration of the wafer at the exposure frequency. It is also possible to develop the resist to provide a relief pattern in the surface of the polyimide, then to take advantage of that pattern and to etch both regions 46' and 48' until windows are opened in polyimide 40' to ends 32 of transfer wires 26. This problem does not arise for the embodiment of FIG. 4a of course, since photoresist 42 is there separated from reflective ends 32 of transfer wires 26 by polyimide layer 40.

Figure 5A:
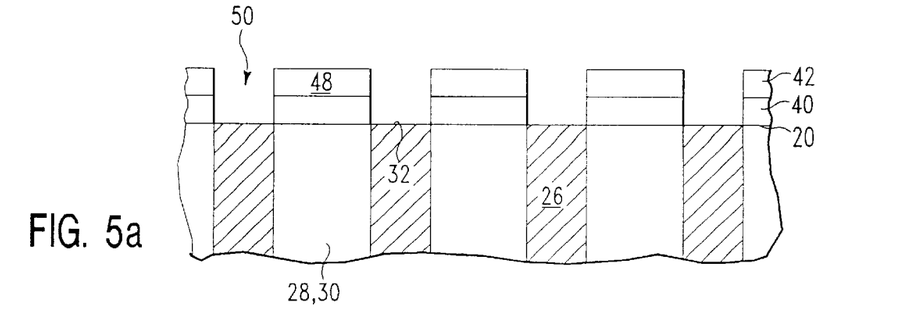
FIGS. 5a–5b are mutually orthogonal cross sectional views of the side face after developing, showing openings in the resist and in the polyimide self-aligned to the transfer wires but no openings over the silicon of adjacent chips.
Figure 5B:
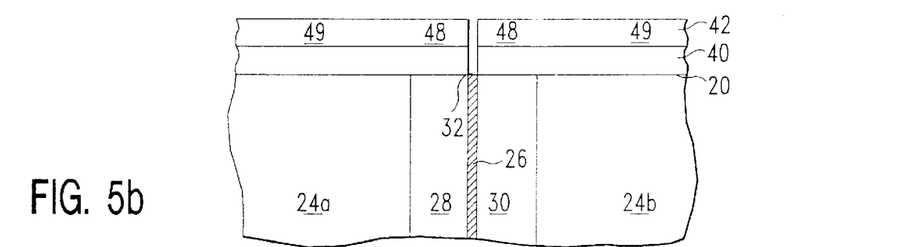

In the next step, resist 40 and polyimide 42 are immersed in developer, which dissolves regions 46 of photoresist 42 and those portions of polyimide 40 that are over reflective ends 32 of transfer metal wires 26, as shown in orthogonal cross sectional views FIGS. 5a and 5b, to provide openings 50 to ends 32 of transfer metal wires 26. Openings 50 are therefore self-aligned to ends 32 of transfer metal wires 26. Openings are not formed in regions 48 or 49 of photoresist 42 that are over polyimide 28, 30 or silicon 24a, 24b.

In the next step, if photoresist was used it is stripped. Polyimide 40 or 40' is then fully cured. As shown in cross sectional view in FIG. 6a and in top view in FIG. 6b, pads 52, known as "T-connect" pads, are formed in contact with ends 32 of transfer metal wires 26 in openings 50 and extending over polyimide 40. T-connect pads are formed photolithographically using standard lift off or etch back techniques. Alternatively T-connect pads can be deposited in a plating step as described in patent application 08/640,379, incorporated herein by reference.

Figure 6A:
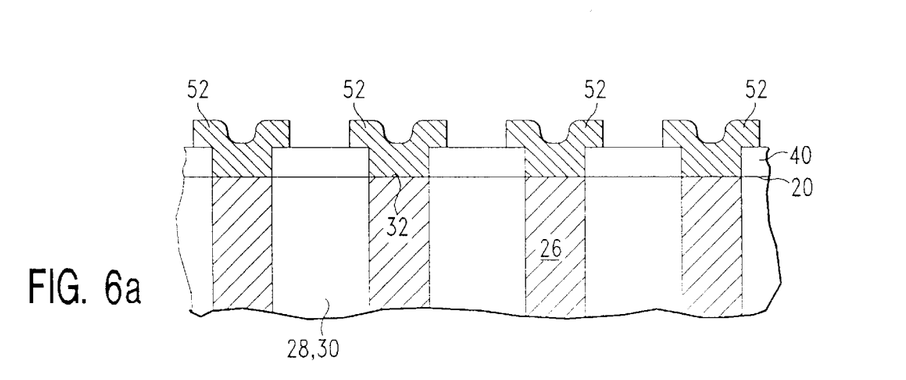
FIG. 6a is a cross sectional view of the side face after T-connect metal deposition.
Figure 6B:
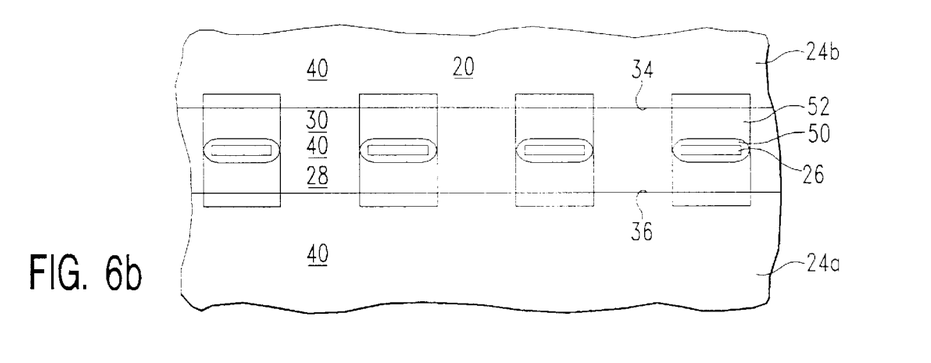
FIG. 6b is a top view of the side face of the stack of chips at the step of FIG. 6a showing openings self-aligned to the transfer metal and the T-connect metal deposited thereon.

While FIGS. 5–6 show only a portion of a single set of transfer wires 26, self-aligned contact openings 50, and T-connect pads 52 between only two chips of a stack, side face 20 of stack 22 actually may have a large number of stacked chips and a large array of transfer metal wires, self-aligned contact openings, and T-connect pads.

Because T-connect pads are large, typically having a dimension of 100 μm square, a single exposure step for the entire stack is adequate to assure overlap between all T-connect pads and all openings 50 of stack 20. Furthermore, the present invention reliably provides insulation on all surfaces except where contact is desired to ends 32 of transfer wires 26, eliminating the possibility of shorting to a silicon substrate surface 24a,24b, for example.

Finally, layers of metals, known as "terminal metals," may be deposited to form solder bumps, or "C4's." The metal deposition uses a process such as evaporation through a mask. The process may use the same mask as was used to form T-connect pads 52 of FIGS. 6a–6b. Alternatively, the terminal metals may be deposited by a process such as plating as described in the 08/640,379 application. The terminal metals may include metals such as chrome, copper, gold, nickel, and solder.

The present invention has several distinct advantages over the contact schemes of the prior art. First, contact opening 50, self-aligned to highly reflective metal, assures that insulation remains properly located on edge 34 of adjacent silicon chip 24b, avoiding the possibility of shorting. This isolation is accomplished by polyimide layer 40 only being opened above ends 32 of transfer wires 26, and not over less reflective silicon surfaces.

In addition, the present invention also provides selectivity to avoid shorting to kerf metal inherent in the process of the '921 Patent. As described hereinabove, in the present invention reflected radiation from metal ends provides an additional dose to the photoresist above the shiny metal ends, whether they be kerf wires or transfer metal wires. But kerf wires, being only about 1 to 2 μm thick, are about half the thickness of transfer wires 26, and they therefore scatter radiation through a larger angle, so the additional reflected dose to the resist above kerf wires is lower than that to the resist above transfer metal end 26. This difference in reflected dose also makes it possible to open the resist above transfer wires without opening the resist above kerf metal wires.

The present invention also finds application for wafer processing. One embodiment provides two levels of metal and connection therebetween on a substrate, such as a semiconductor wafer. Each of the two levels of metal have nearly planar insulation self-aligned to the metal as provided in this invention. As further described below, the invention provides significant process simplification as compared with traditional processes.

Figure 7A:
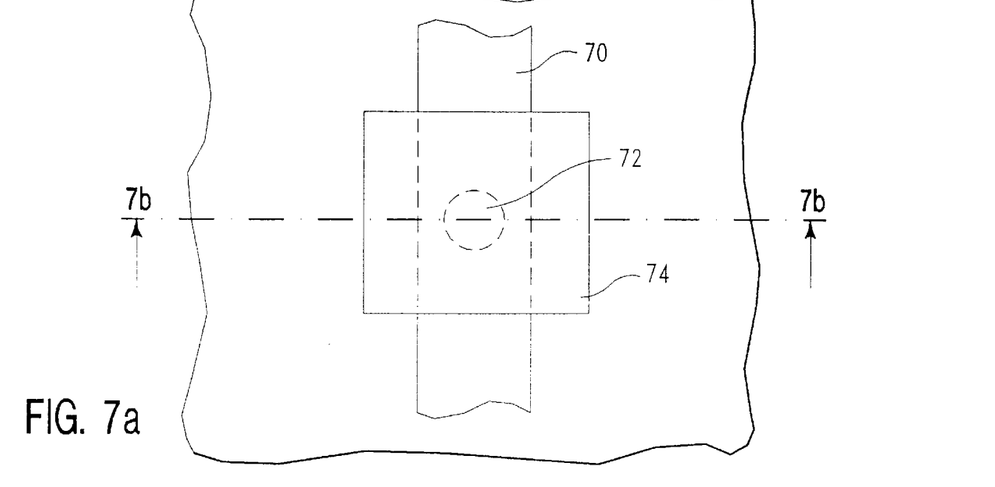
FIG. 7a is a top view of a wafer showing a metal line, a pad, and a stud therebetween formed using the process of the present invention.
Figure 7B:
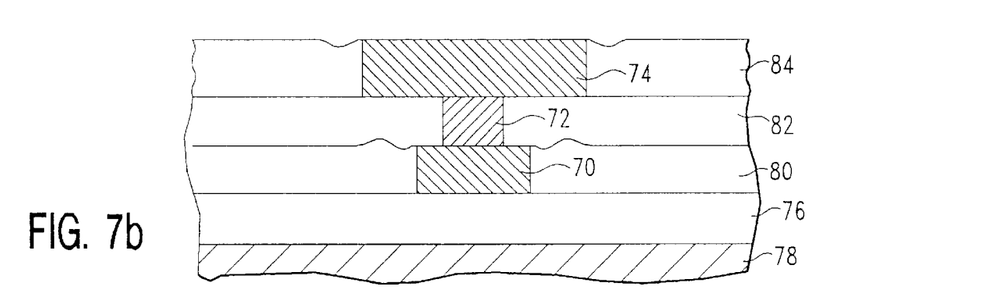
FIG. 7b is a cross sectional view through the structure of FIG. 7a, showing the planar self-aligned insulators of the present invention.

FIG. 7a shows a top view of the final structure in which line 70 is connected through stud 72 to pad 74. FIG. 7b is a cross section through FIG. 7a showing another view of the connection between line 70, stud 72, and pad 74 on insulation 76 on wafer 78. There may be other levels of metal and contacts to devices on wafer 78 or between wafer 78 and line 70, but these are omitted for clarity. FIG. 7b also shows insulation 80 self-aligned to line 70, insulation 82 self-aligned to stud 72, and insulation 84 self-aligned to pad 74. Insulation 80 and insulation 84 are planarized and self-aligned to their respective metallurgies using the process of the present invention. Insulation 82 is formed using a traditional mask and photolithography step and planarized using chemical-mechanical polishing as more fully described hereinbelow.

Figure 8:
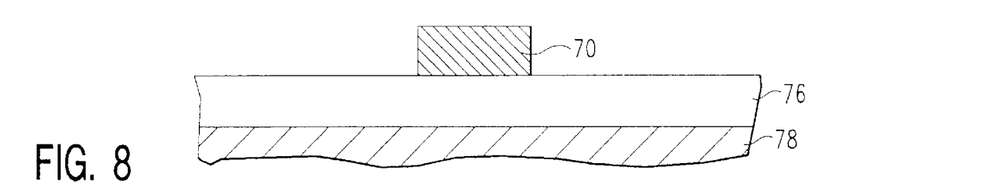
FIGS. 8–16 show steps in the process of fabricating the structure of FIGS. 7a and 7b.

FIGS. 8–16 illustrate the steps in the process of fabricating the structure of FIGS. 7a and 7b. As shown in FIG. 8, line 70 is formed on insulation 76 on wafer 78 by either a standard metal deposition, masking and etchback process or by a standard or masking, metal deposition, and liftoff process, both of which are well known in the art. Preferably the surface of insulation 76 has significantly lower reflectivity than line 70.

Figure 9:
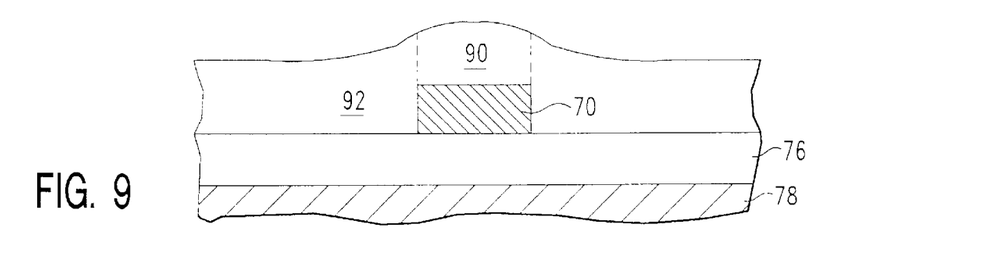
Figure 10:
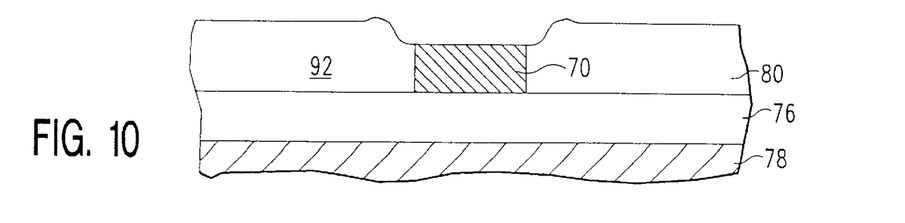

Photoactive polyimide insulator 80 is deposited, as shown in FIG. 9, such that upon curing its thickness is about equal to the thickness of metal line 70. Photoactive polyimide 80 is then given a blanket exposure according to the process of the present invention. Because of the added dose to photoactive polyimide 80 in region 90 from reflection from metal line 70, region 90 of photoactive polyimide insulator 80 is exposed sufficiently to develop out, while adjacent regions 92 receive less than a threshold dose, as shown in FIG. 10. Alternatively, photoresist on an insulator can be used instead of photoactive polyimide, as described hereinabove.

Figure 11:
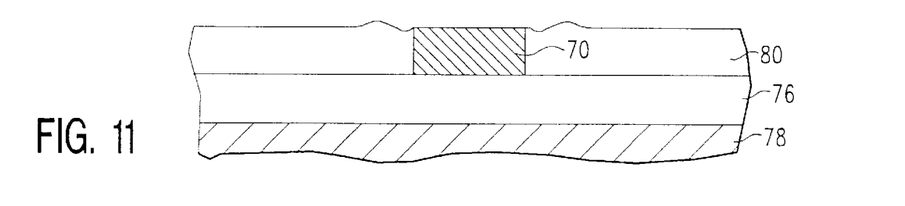

In the next step, shown in FIG. 11, polyimide insulator 80 is cured, the curing step causing shrinkage of polyimide insulator 80 to about the height of metal line 70. Thus, nearly planar polyimide insulator 80 is formed self-aligned to line 70.

Figure 12:
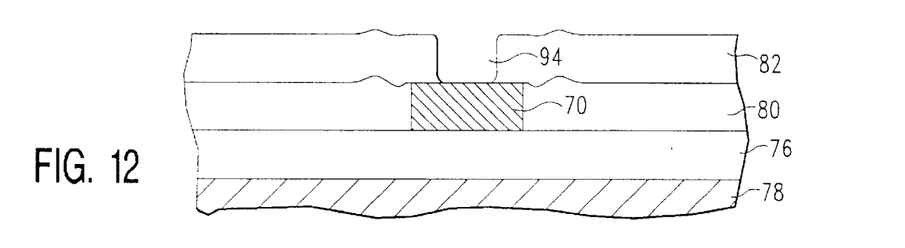
Figure 13:
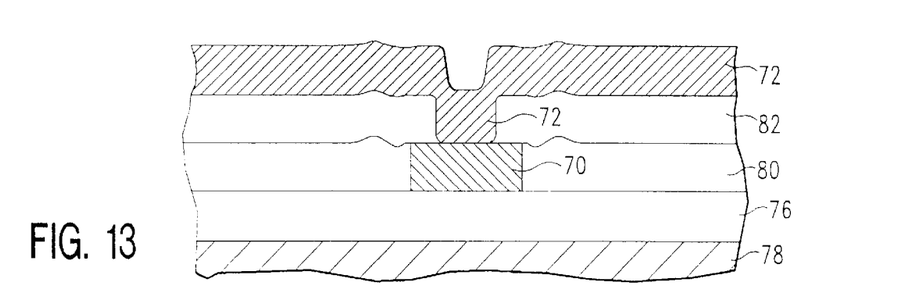
Figure 14:
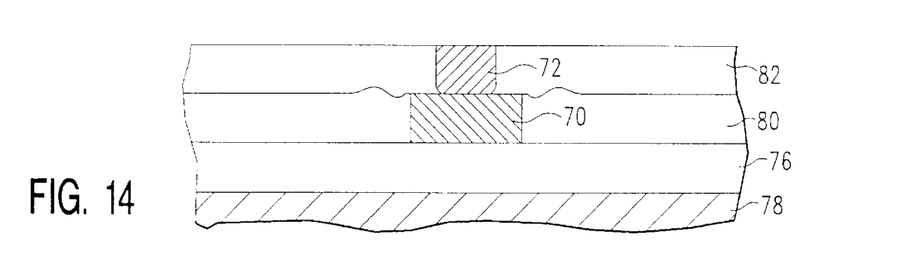
Figure 16:
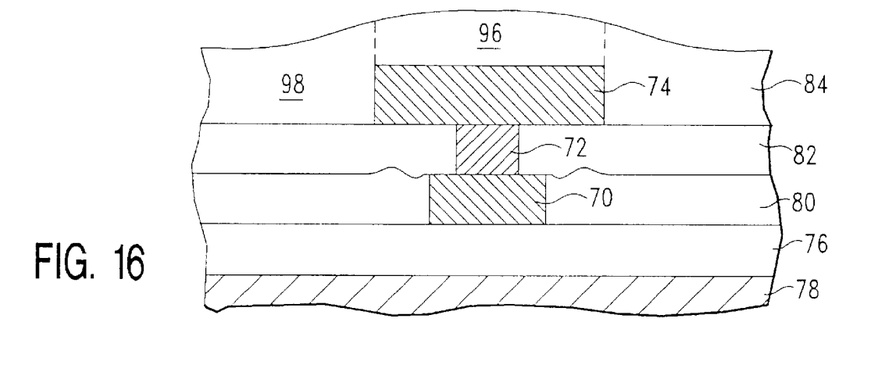

Photoactive polyimide insulator 82 is then deposited, as shown in FIG. 12. A standard photomasking step follows to provide opening 94 in insulator 82 over line 70. Metal is then deposited, as shown in FIG. 13, filling opening 94. Standard chemical-mechanical polishing is then used to planarize insulator 82 coplanar with metal stud 72, as shown in FIG. 14. It is preferable that insulator 82 be highly absorbing of radiation to prevent reflection from underlying layers in steps that follow (FIG. 16).

Figure 15:
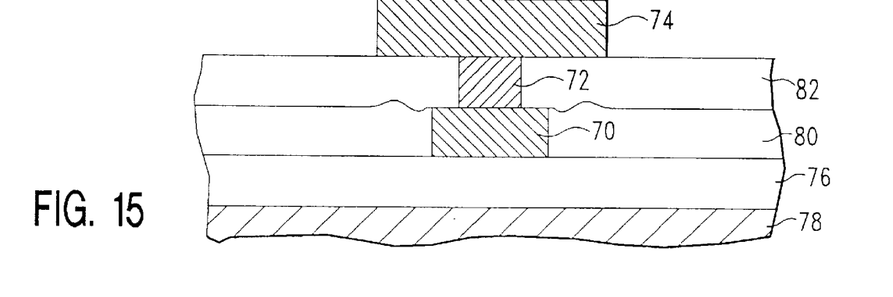

As shown in FIG. 15, pad 74 is then formed on stud 72 by either metal deposition, masking and etchback or by masking, metal deposition, and liftoff, as described above for line 70 (FIG. 8). Photoactive polyimide insulator 84 is then deposited, as shown in FIG. 16. Preferably, polyimide insulator 84 has sufficient thickness that upon curing in a subsequent step, it will be about equal in thickness to metal line 70. Photoactive polyimide 84 is then given a blanket exposure according to the process of the present invention. Because of the added dose to photoactive polyimide 84 in region 96 from reflection from metal pad 74, region 96 of photoactive polyimide insulator 84 is exposed sufficiently to develop out, while adjacent regions 98 receive less than a threshold dose, in a manner similar to that shown in FIG. 10 for insulator 70. Finally, as shown in FIG. 7b, polyimide insulator 84 is cured, the curing step causing shrinkage of polyimide insulator 84 to about the height of metal pad 74. Thus, nearly planar polyimide insulator 84 is formed self-aligned to pad 74.

To summarize, the present process provides three metal levels and three insulating levels with 3 masking steps, 2 blanket exposure steps, 2 lift-off or etch steps, and 1 CMP step. This compares favorably to the traditional process that requires 6 masking steps and 3 lift-off or etch steps. It also appears to provide advantage compared with the standard CMP process that uses 3 masking steps and 3 CMP steps.

Figure 17:
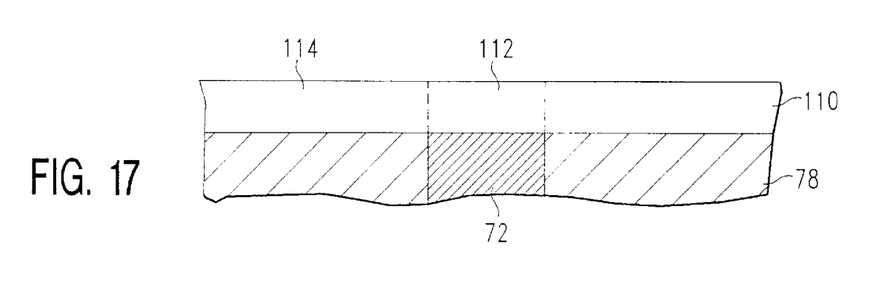
FIGS. 17–18 show steps in the process of fabricating an insulator self-aligned to a stud.
Figure 18:
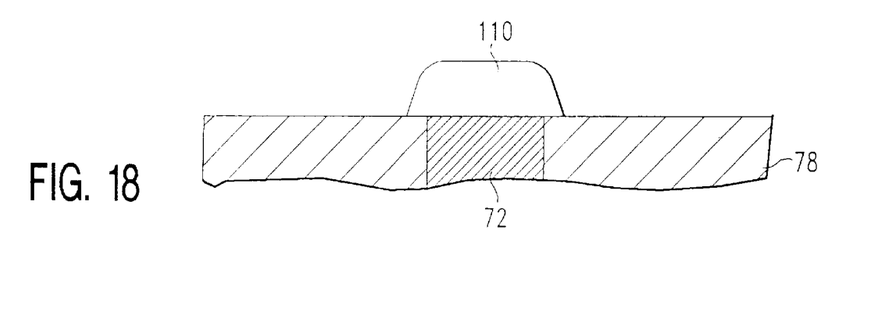

Another embodiment for using the invention is presented below with reference to FIGS. 17 and 18. This embodiment provides insulation self-aligned to a metal line on a substrate, such as a semiconductor wafer or a side face of a chip stack. As shown in FIG. 17, negative photoactive material 110 is deposited to coat wafer 78 having stud 72. Photoactive material 110 is then given a blanket exposure according to the process of the present invention. Because of the added dose to photoactive material 110 in region 112 because of reflection from metal stud 72, region 112 of negative photoactive material 110 is exposed sufficiently to remain while adjacent regions 114 receive less than a threshold dose, and develop out as shown in FIG. 18. Sufficient bias is included in the photoexposure and develop processes to assure that material 110 completely covers stud 72 after curing. Thus, insulator 110 is formed self-aligned to stud 72 by virtue of an opening being formed in insulator 110 elsewhere.

While several embodiments of the invention, together with modifications thereof, have been described in detail herein and illustrated in the accompanying drawings, it will be evident that various further modifications are possible without departing from the scope of the invention. For example, a wide range of high contrast photosensitive materials known in the art can be used. Similarly, a wide range of radiation sources can be used. Similarly, the photoresist may be selectively double exposed by radiation mechanisms in addition to reflection, such as photoelectrons and fluorescence. Nothing in the above specification is intended to limit the invention more narrowly than the appended claims. The examples given are intended only to be illustrative rather than exclusive.

What is claimed is:

1. A method of forming a self-aligned opening on a semiconductor wafer, the semiconductor wafer having an absorbance, comprising the steps of:
    (a) providing a surface having a first region and a second region, said first region having a first magnitude of an optical property, said second region having a second magnitude of an optical property, there being a difference in said optical property magnitudes between said first and second regions;
    (b) depositing a first permanent layer of insulation on said first and second regions;
    (c) depositing a layer of photoactive material on said layer of insulation on said first and second regions;
    (d) shining equal incident radiation on said photoactive material on said first and second regions wherein said photoactive material on said first and second regions is differentially exposed as a result of said difference in optical property magnitude; and
    (e) forming an opening in said layer of photoactive material self-aligned to said first region;
    wherein said first permanent layer of insulation has an absorbance higher than the semiconductor's absorbance for said radiation of said shining step (d) and wherein said first permanent layer of insulation has a thickness sufficient to provide electrical insulation.

2. A method as recited in claim 1, said photoactive material of step (c) comprising a photoactive polyimide.

3. A method as recited in claim 2, wherein said photoactive polyimide is deposited with a thickness set to be substantially planar with said first region when processing is complete.

4. A method as recited in claim 2, wherein said forming step (e) comprises the step of developing to form a relief pattern in said first permanent layer of insulation and then blanket etching to fully open said pattern.

5. A method as recited in claim 1, said forming step (e) comprising the step of developing.

6. A method as recited in claim 1, said radiation shining step (c) comprising the step of shining a uniform beam of electromagnetic radiation.

7. A method as recited in claim 1, said optical property being reflectivity.

8. A method as recited in claim 7, wherein said equal incident radiation shining step (d) provides a first dose to said photoactive material on said first region and a second dose to said photoactive material on said second region, said first dose including a higher amount of reflected radiation than said second dose, said first dose sufficient to activate said photoactive material on said first region, said second dose being lower than required to activate said photoactive material on said second region, said doses being different as a result of differences in magnitude of reflectivity of said first and said second regions.

9. A method as recited in claim 8, said first region comprising a polished metal.

10. A method as recited in claim 9, said surface being a side face of a stack of integrated circuit chips, said first region being an end of a wire extending through insulation to said side face.

11. A method as recited in claim 10, further comprising depositing a metal in said opening in electrical contact with said end of said wire.

12. A method as recited in claim 11, said metal comprising a T-connect pad.

13. A method as recited in claim 8, said surface being a planar surface of a wafer, said first region being a metal line.

14. A method as recited in claim 1, wherein in said depositing step (b) said first permanent layer of insulation is deposited with a thickness set to be substantially planar with said first region when processing is complete.

15. A method as recited in claim 1, said first permanent layer of insulation being polyimide, said first region being a metal line or pad, said optical property being reflectance.

16. A method as recited in claim 1, said first region comprising a first metal, said method further comprising the steps of:
    depositing a second metal in electrical contact with said first metal; and
    depositing a second layer of insulation self-aligned to said second metal.

17. A method as recited in claim 1, wherein in said forming step (d), forming said opening in said layer of photoactive material in said second region.

18. A method of forming a self-aligned opening, comprising the steps of:

(a) providing a surface having a first region and a second region, said first region having a first magnitude of an optical property, said second region having a second magnitude of an optical property, there being a difference in said optical property magnitudes between said first and second regions;

(b) depositing a layer of insulator on said first and second regions, wherein said insulator has a thickness sufficient to provide electrical insulation;

(c) depositing a layer of photoactive material on said first and second regions;

(d) shining equal incident radiation on said photoactive material on said first and second regions wherein said photoactive material on said first and second regions are differentially exposed as a result of said difference in optical property magnitude; and (e) forming an opening in said layer of photoactive material self-aligned to said first region;

wherein said first region of said step (a) has a width and said layer of insulator of said step (b) has a thickness, said width being greater than said thickness, and wherein said first region comprises a first wire, said method further comprising a second wire, said second wire having a width less than said first wire, wherein in said forming step (e), forming said opening in said layer of photoactive material above said first wire but not above said second wire.

* * * * *